United States Patent
Kawano

(10) Patent No.: US 9,209,769 B2
(45) Date of Patent: Dec. 8, 2015

(54) POWER AMPLIFIER AND COMMUNICATION DEVICE

(71) Applicant: FUJITSU SEMICONDUCTOR LIMITED, Yokohama-shi, Kanagawa (JP)

(72) Inventor: Yoichi Kawano, Setagaya (JP)

(73) Assignee: SOCIONEXT INC., Yokohama (JP)

( * ) Notice: Subject to any disclaimer, the term of this patent is extended or adjusted under 35 U.S.C. 154(b) by 75 days.

(21) Appl. No.: 14/227,975

(22) Filed: Mar. 27, 2014

(65) Prior Publication Data

US 2014/0295781 A1    Oct. 2, 2014

(30) Foreign Application Priority Data

Apr. 1, 2013    (JP) ................. 2013-076418

(51) Int. Cl.
| | |
|---|---|
| *H04B 1/04* | (2006.01) |
| *H03F 3/68* | (2006.01) |
| *H03G 3/30* | (2006.01) |
| *H03F 3/21* | (2006.01) |
| *H03F 3/19* | (2006.01) |
| *H03F 1/02* | (2006.01) |
| *H03F 3/24* | (2006.01) |

(52) U.S. Cl.
CPC ........... *H03G 3/3042* (2013.01); *H03F 1/0277* (2013.01); *H03F 3/19* (2013.01); *H03F 3/211* (2013.01); *H03F 3/245* (2013.01); *H03F 2200/537* (2013.01); *H03F 2200/541* (2013.01)

(58) Field of Classification Search
CPC ... H03F 1/0277; H03F 3/24; H03F 2200/387; H03F 2200/451; H03F 2200/537; H03F 2200/541; H04B 1/0408; H04B 1/0458; H04B 1/0483; H04B 1/40

USPC ........... 455/127.2, 127.3; 330/151, 165, 171, 330/177, 252, 295

See application file for complete search history.

(56) References Cited

U.S. PATENT DOCUMENTS

| | | | |
|---|---|---|---|
| 5,548,246 A | 8/1996 | Yamamoto et al. | |
| 6,529,065 B2 * | 3/2003 | Forstner et al. | 327/538 |
| 7,489,910 B2 * | 2/2009 | Kato et al. | 455/127.2 |
| 7,728,661 B2 | 6/2010 | Bockelman et al. | |
| 7,859,333 B2 * | 12/2010 | Wright | 330/124 R |

(Continued)

FOREIGN PATENT DOCUMENTS

| | | |
|---|---|---|
| JP | 7-336168 A | 12/1995 |
| JP | 2006-333060 A | 12/2006 |

*Primary Examiner* — Quochien B Vuong
(74) *Attorney, Agent, or Firm* — Arent Fox LLP

(57) ABSTRACT

A power amplifier, includes: a first and a second amplifier circuits that are controlled so that one of them do not amplify a signal when another one of them amplifies the signal; a first impedance conversion circuit, coupled between the first amplifier circuit and the output terminal, that converts an output impedance of the first amplifier circuit; a second impedance conversion circuit, coupled between the second amplifier circuit and a wiring coupling the first impedance conversion circuit and the output terminal, that converts an output impedance of the second amplifier circuit; and a connection circuit that, when the first amplifier circuit amplifies the signal, forms a path which bypasses the second impedance conversion circuit between a reference potential and the wiring coupling the first impedance conversion circuit and the output terminal, by coupling a wiring coupling the first amplifier circuit and the output terminal, with the reference potential.

19 Claims, 17 Drawing Sheets

(56) References Cited

U.S. PATENT DOCUMENTS

| | | | |
|---|---|---|---|
| 7,952,433 B2 * | 5/2011 | An et al. | 330/295 |
| 8,130,043 B2 * | 3/2012 | Arell | 330/295 |
| 8,330,544 B2 * | 12/2012 | Kawakami et al. | 330/276 |
| 8,947,165 B2 * | 2/2015 | Cho et al. | 330/295 |
| 2006/0267684 A1 | 11/2006 | Ohnishi et al. | |

* cited by examiner

POWER AMPLIFIER AND COMMUNICATION DEVICE

CROSS-REFERENCE TO RELATED APPLICATION

This application is based upon and claims the benefit of priority of the prior Japanese Patent Application No. 2013-076418 filed on Apr. 1, 2013, the entire contents of which are incorporated herein by reference.

FIELD

A certain aspect of the embodiments is related to a power amplifier and a communication device.

BACKGROUND

A portable communication device, such as a cell phone and a smart phone, has spread. The duration time of a battery is considered as an important performance of the portable communication device. One of the parameters which influence the duration time of the battery is an amplification efficiency of a power amplifier which amplifies an electric power of a signal transmitted from an antenna.

As an output power becomes large, the power amplifier indicates a high amplification efficiency. In the range in which the output power becomes maximum (e.g. 24 (dBm)), the amplification efficiency is highest. Considering the actual use status of a portable communication device, the use frequency in the maximum output power is low. Since the use frequency becomes highest in the range of approximately the half of the maximum output power or less than it, high amplification efficiency is not acquired. Here, the output power is determined according to a distance to a base station, a type of communication (data, a sound, and so on), and a communication method (GSM (Global System for Mobile Communications, registered trademark) and so on), for example.

In order to realize high efficiency, the power amplifier called a multi-mode power amplifier is used. With the multi-mode power amplifier, the highest amplification efficiencies are acquired in different output powers, respectively, by using a plurality of amplifying elements properly having different sizes. As the sizes of the amplifying elements become large, the output powers when the amplification efficiencies becomes highest are large. When the output powers are a small level, a middle level and a large level (e.g. 24 (dBm), 14 (dBm) and 4 (dBm)) in order of the large size, three kinds of amplifying elements whose amplification efficiencies become highest are used properly according to the output powers, and hence high amplification efficiencies are acquired.

With respect to the multi-mode power amplifier, Patent Document 1 (i.e., U.S. Pat. No. 7,728,661) discloses a configuration in which amplifiers with high output power and amplifiers with low output power which amplify a RF (Radio Frequency) signal are coupled to a load resistance through transformers, respectively.

SUMMARY

According to an aspect of the present invention, there is provided a power amplifier, including: a first amplifier circuit and a second amplifier circuit that are controlled so that one of the first and the second amplifier circuits does not amplify a signal when another one of the first and the second amplifier circuits amplifies the signal, the another one configured to amplify the signal and to output the amplified signal from a common output terminal; a first impedance conversion circuit that is coupled between the first amplifier circuit and the output terminal, and is configured to convert an output impedance of the first amplifier circuit; a second impedance conversion circuit that is coupled between the second amplifier circuit and a wiring coupling the first impedance conversion circuit and the output terminal, and is configured to convert an output impedance of the second amplifier circuit; and a connection circuit that, when the first amplifier circuit amplifies the signal, forms a path which bypasses the second impedance conversion circuit between a reference potential and the wiring coupling the first impedance conversion circuit and the output terminal, by coupling a wiring coupling the first amplifier circuit and the output terminal, with the reference potential.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the power amplifier, when the amplifiers with the high output power and the amplifiers with the low output power are used properly, respective amplifiers are coupled with each other at the output side, and hence the influence on an in-use amplifier by an unused amplifier poses a problem.

For example, in the configuration of FIGS. 6A and 6B of the Patent Document 1 (i.e., U.S. Pat. No. 7,728,661), the amplifiers (320a and 320b) with the high output power and the amplifiers (310a and 310b) with the low output power are coupled with each other at the output side, through the transformers (330 and 340), respectively. In addition, an equivalent circuit at the time of use of an amplification circuit with the high output power is described in FIG. 6B of the Patent Document 1. Here, since the unused amplifier with the low output power is in a low impedance state, an equivalent impedance $L'_L$ of a circuit in the unused amplifier with the low output power mainly includes an inductance and a parasitic resistance of the transformer (330). Since the parasitic resistance causes a power loss, the parasitic resistance reduces the amplification efficiency.

Here, such a loss arises similarly when the amplifier with the low output power is used. When the amplifier with the high output power is used, a large current flows compared with the case where the amplifier with the low output power is used, so that a larger loss arises.

A description will be given of the power amplifier according to the embodiments, with reference to the drawings.

Figure 1:
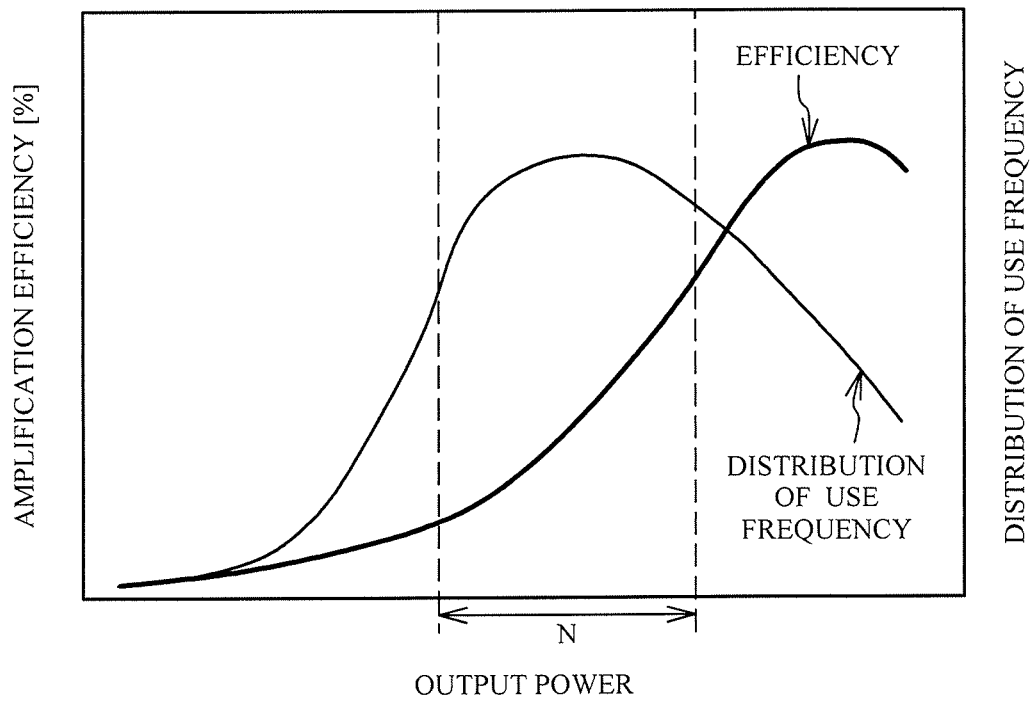
FIG. 1 is a graph illustrating the change of an amplification efficiency and the distribution of an use frequency to the output power of a power amplifier according to a comparative example.

FIG. 1 is a graph illustrating the change of an amplification efficiency and the distribution of an use frequency to the output power of a power amplifier according to a comparative example. As the output power becomes large, the power amplifier indicates high amplification efficiency. The peak of the distribution of the use frequency is in the range of approximately the half of the maximum output power or less than it (see a mark "N"). For this reason, high amplification efficiency is not acquired in the range of the output power in which the use frequency is high. Therefore, in order to realize high efficiency, a multi-mode amplifier including a plurality of power amplifiers having different sizes is used.

Figure 2:
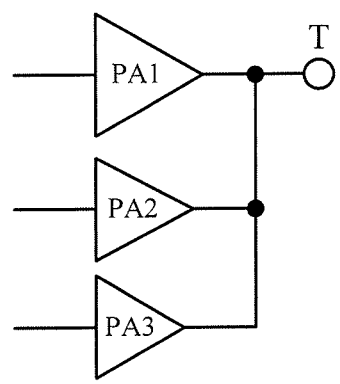
FIG. 2 is a schematic block diagram of an example of a multi-mode power amplifier.

FIG. 2 is a schematic block diagram of an example of the multi-mode power amplifier. The multi-mode power amplifier includes three power amplifiers PA1 to PA3 coupled with a common output terminal T, for example. It is assumed that the sizes of the amplifiers are large in order of the amplifier PA1, the amplifier PA2 and the amplifier PA3.

Figure 3:
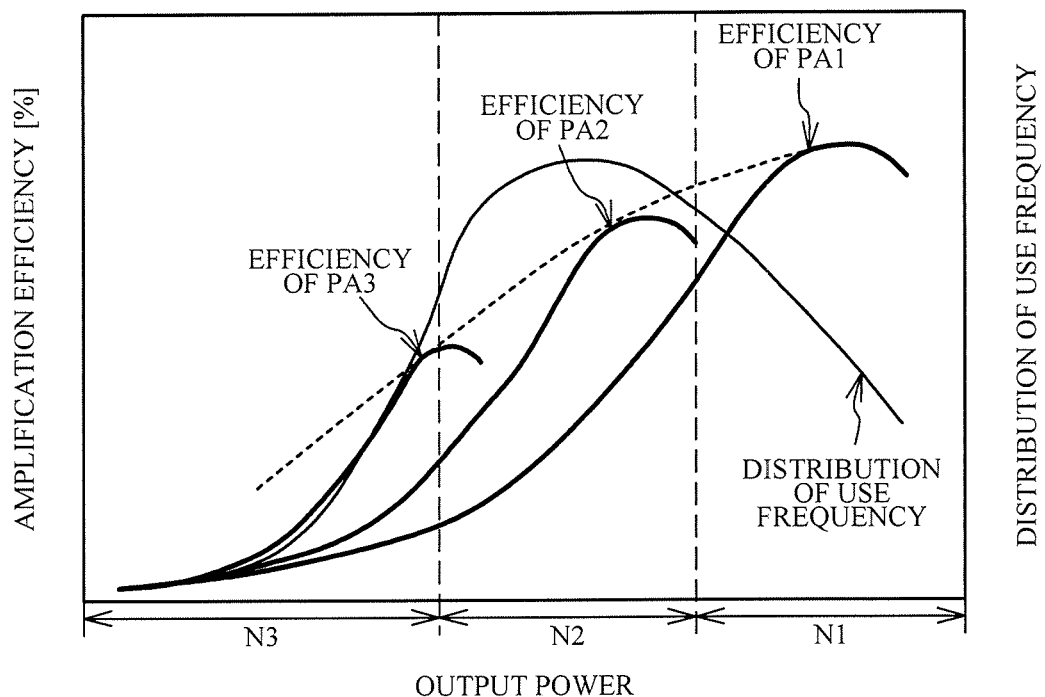
FIG. 3 is a graph illustrating the change of the amplification efficiency and the distribution of the use frequency to the output power of the multi-mode power amplifier.

FIG. 3 is a graph illustrating the change of the amplification efficiency and the distribution of the use frequency to the output power of the multi-mode power amplifier. Since maximum output powers are different from each other, three amplifiers PA1 to PA3 indicate maximum amplification efficiencies in output powers which are different from each other. The amplifier PA1 indicates the maximum amplification efficiency in a high output power (see a mark N1). The amplifier PA2 indicates the maximum amplification efficiency in a middle output power (see a mark N2). Here, a range of the middle output power is identical with a range N in which the distribution of the use frequency becomes a peak. Moreover, the amplifier PA3 indicates the maximum amplification efficiency in the range N3 of a low output power (see a mark N3).

Each of three amplifiers PA1 to PA3 is properly used according to a desired output power. The amplifier PA1 is used in the range N1 of the high output power, and the amplifier PA2 is used in the range N2 of the middle output power. Moreover, the amplifier PA3 is used in the range N3 of the low output power.

An operating voltage required for amplification (e.g. a voltage exceeding a threshold voltage of a built-in transistor) is applied to the amplifier selected as a use target, and the amplifier selected as the use target amplifies an input signal and outputs the amplified signal from the output terminal T. The amplifiers other than the selected amplifier are maintained in a low impedance state. Thus, the multi-mode power amplifier selects one from the amplifiers PA1 to PA3 according to the desired output power, and uses the selected amplifier, so that overall amplification efficiency can be improved (see a dotted line).

The power amplifier according to the following embodiments has a transformer which transforms the output impedance of each amplification circuit included in multi-mode power amplifier so that the impedance matching characteristic between the power amplifier and a load circuit improves. A part of a current which flows into the load circuit from an in-use amplification circuit flows into the transformer of an unused amplification circuit, and hence the transformer of the unused amplification circuit becomes a factor which causes power loss by a parasitic resistance. For this reason, the power amplifier according to the embodiment is equipped with a switching means that switches a current path so as to restrain the inflow of the current to the transformer.

First Embodiment

Figure 4:
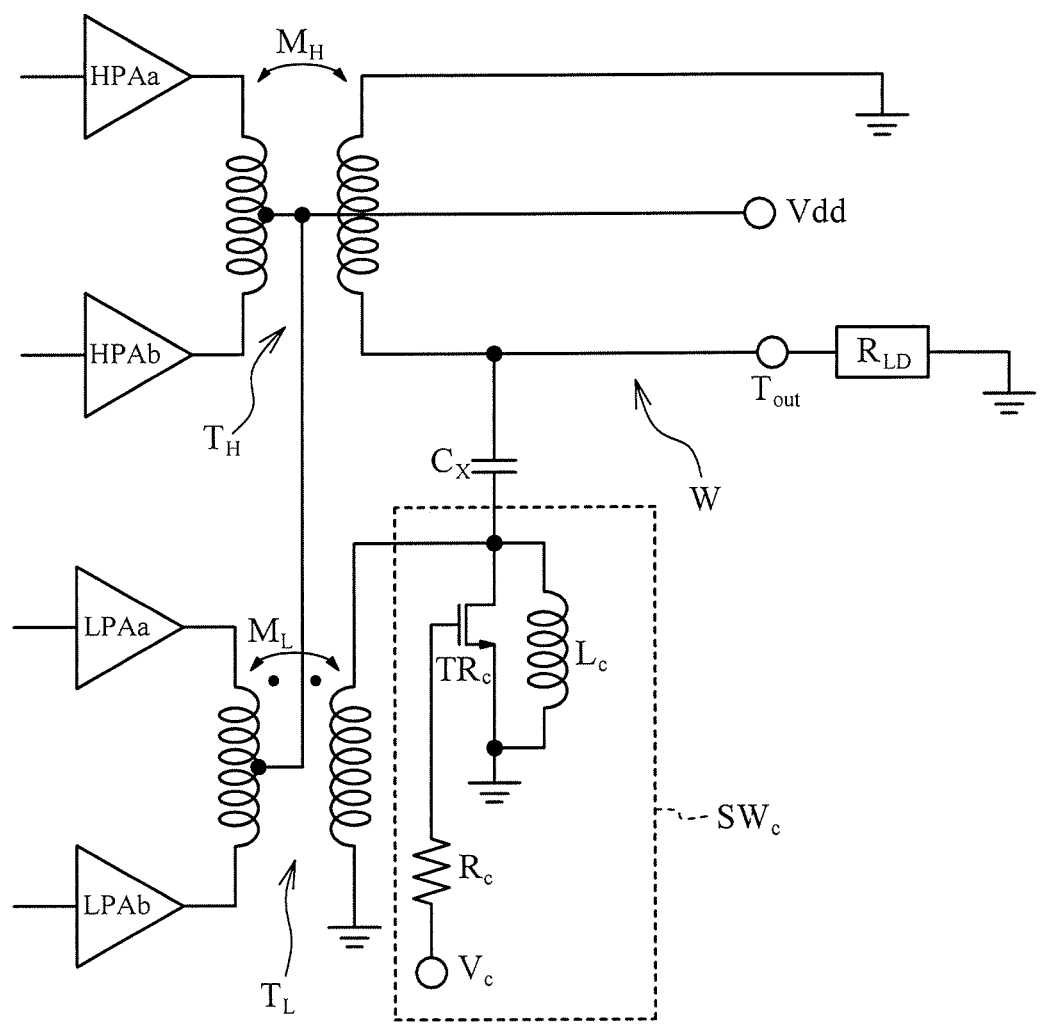
FIG. 4 is a circuit diagram illustrating the circuit configuration of a power amplifier according to a first embodiment.

FIG. 4 is a circuit diagram illustrating the circuit configuration of the power amplifier according to a first embodiment. The power amplifier includes: high power amplification circuits (a first amplification circuit) HPAa and HPAb; low power amplification circuits (a second amplification circuit) LPAa and LPAb; a high power side transformer (a first impedance conversion circuit) $T_H$; and a low power side transformer (a second impedance conversion circuit) $T_L$. Moreover, the power amplifier includes: a matching capacitor Cx, a switch circuit (a connection circuit) SWc, and an output terminal Tout.

The high power amplification circuits HPAa and HPAb and the low power amplification circuits LPAa and LPAb are coupled with the common output terminal Tout. When any ones of the high power amplification circuits HPAa and HPAb and the low power amplification circuits LPAa and LPAb amplify an RF (Radio Frequency) signal, another ones do not amplify the RF signal. Any ones of the high power amplification circuits HPAa and HPAb and the low power amplification circuits LPAa and LPAb amplify the RF signal, and output the amplified RF signal from the common output terminal Tout. That is, the operating voltage required for amplification is given to only ones selected as use targets from among the high power amplification circuits HPAa and HPAb and the low power amplification circuits LPAa and LPAb, from the outside, and the selected power amplification circuits operate. The RF signal outputted from the output terminal Tout is inputted to the load circuit $R_{LD}$ of 50 (Ω; ohm), for example. Here, the output of the high power amplification circuits HPAa and HPAb is obtained as a difference between the output of a positive-phase amplifier and the output of a negative-phase amplifier. Similarly, the output of the low power amplification circuits LPAa and LPAb is obtained as a difference between the output of a positive-phase amplifier and the output of a negative-phase amplifier.

The size of the transistor (amplifying element) which is built into each of the high power amplification circuits HPAa and HPAb is larger than that of each of the low power amplification circuits LPAa and LPAb. The high power amplification circuits HPAa and HPAb output the RF signal having an output power higher than the low power amplification circuits LPAa and LPAb. Therefore, as illustrated in FIG. 3, when the output power is large, the high power amplification circuits HPAa and HPAb are used. When the output power is small, the low power amplification circuits LPAa and LPAb are used. Here, as an operating state of the power amplifier according to the present embodiment, a mode in which the high power amplification circuits HPAa and HPAb are used is written as a "high power mode", and a mode in which the low power amplification circuits LPAa and LPAb are used is written as a "low power mode".

A primary side of the high power side transformer $T_H$ is magnetically coupled to a secondary side thereof by a mutual inductance $M_H$. The primary side of the high power side transformer $T_H$ is coupled with the high power amplification circuits HPAa and HPAb, and a power supply terminal of a power supply voltage Vdd. On the contrary, one end of the secondary side of the high power side transformer $T_H$ is coupled with the output terminal Tout, and another end thereof is grounded.

The high power side transformer $T_H$ is coupled between the high power amplification circuits HPAa and HPAb and the output terminal Tout, and converts an output impedance of the high power amplification circuits HPAa and HPAb. The converted output impedance may be 50 ($\Omega$) according to the load circuit $R_{LD}$, for example.

A primary side of the low power side transformer $T_L$ is magnetically coupled to a secondary side thereof by a mutual inductance $M_L$. The primary side of the low power side transformer $T_L$ is coupled with the low power amplification circuits LPAa and LPAb, and the power supply terminal of the power supply voltage Vdd. On the contrary, one end of the secondary side of the low power side transformer $T_L$ is coupled with a wiring W coupling the high power side transformer $T_H$ and the output terminal Tout, via the matching capacitor Cx, and another end thereof is grounded. That is, the low power side transformer $T_L$ is coupled between the low power amplification circuits LPAa and LPAb and the wiring W.

The low power side transformer $T_L$ converts an output impedance of the low power amplification circuits LPAa and LPAb. The converted output impedance may be 50 ($\Omega$) according to the load circuit $R_{LD}$, for example. Here, since the one end of the secondary side of each of the high power side transformer $T_H$ and the low power side transformer $T_L$ is grounded, the outputs of the high power amplification circuits HPAa and HPAb and the low power amplification circuits LPAa and LPAb become single phase outputs, respectively. However, the outputs of the high power amplification circuits HPAa and HPAb and the low power amplification circuits LPAa and LPAb are not limited to this, but may be differential outputs.

One end of the matching capacitor Cx is coupled with the wiring W coupling the high power side transformer $T_H$ and the output terminal Tout. Another end of the matching capacitor Cx is coupled with the switch circuit SWc and the low power side transformer $T_L$. The matching capacitor Cx is used for impedance matching. The capacitance of the matching capacitor Cx is determined according to parameters, such as wiring capacitance of the wiring W and the load circuit $R_{LD}$, for example.

The switch circuit SWc is coupled with the wiring W coupling the high power side transformer $T_H$ and the output terminal Tout, via the matching capacitor Cx. In the high power mode, i.e., when the high power amplification circuits HPAa and HPAb amplify the RF signal, the switch circuit SWc couples the wiring W coupling the high power side transformer $T_H$ and the output terminal Tout, with a ground which is a reference potential. Thereby, the switch circuit SWc forms a current path which bypasses the low power side transformer $T_L$ between the wiring W and the ground.

In the high power mode, a part of the current of the RF signal which flows into the output terminal Tout from the high power amplification circuits HPAa and HPAb via the high power side transformer $T_H$ is led to the switch circuit $SW_C$ instead of the low power side transformer $T_L$. That is, the switch circuit $SW_C$ controls the path of the current which flows into the ground from the wiring W.

More specifically, the switch circuit $SW_C$ includes a transistor TRc, an inductance element Lc, an input terminal of a control voltage Vc, and an adjusting resistor Rc. The inductance element $L_C$ is coupled in parallel with the transistor $TR_C$. That is, one end of the inductance element $L_C$ is coupled twi th source terminal of the transistor $TR_C$, and another end of the inductance element $L_C$ is coupled with a drain terminal of the transistor $TR_C$.

In the transistor $TR_C$, the source terminal is grounded, and the drain terminal is coupled with the wiring W coupling the high power side transformer $T_H$ and the output terminal Tout. Moreover, a gate terminal of the transistor $TR_C$ is coupled with the input terminal of the control voltage Vc via the adjusting resistor Rc. Here, it is assumed that the transistor $TR_C$ is a FET (Field Effect Transistor). However, the transistor $TR_C$ is not limited to this, and may be a bipolar transistor.

The control voltage Vc is applied to the gate terminal of the transistor $TR_C$ from the outside. At this time, the control voltage Vc is adjusted to a suitable value by the adjusting resistor $R_C$.

The transistor TRc is switched to a conduction state or a non-conduction state according to the control voltage Vc. More specifically, when the high power amplification circuits HPAa and HPAb amplify the RF signal, the transistor TRc becomes the conduction state. When the low power amplification circuits LPAa and LPAb amplify the RF signal, the transistor TRc becomes the non-conduction state. That is, the control voltage Vc is determined according to the operating state (i.e., the high power mode or the low power mode) of the power amplifier.

Therefore, in the high power mode, the transistor TRc becomes the conduction state, and the wiring W coupling the high power side transformer $T_H$ and the output terminal Tout is coupled with the ground via the matching capacitor Cx and an ON-resistor of the transistor TRc. That is, the wiring W is coupled with the ground in the viewpoint of an AC (Alternate Current) signal.

Figure 5:
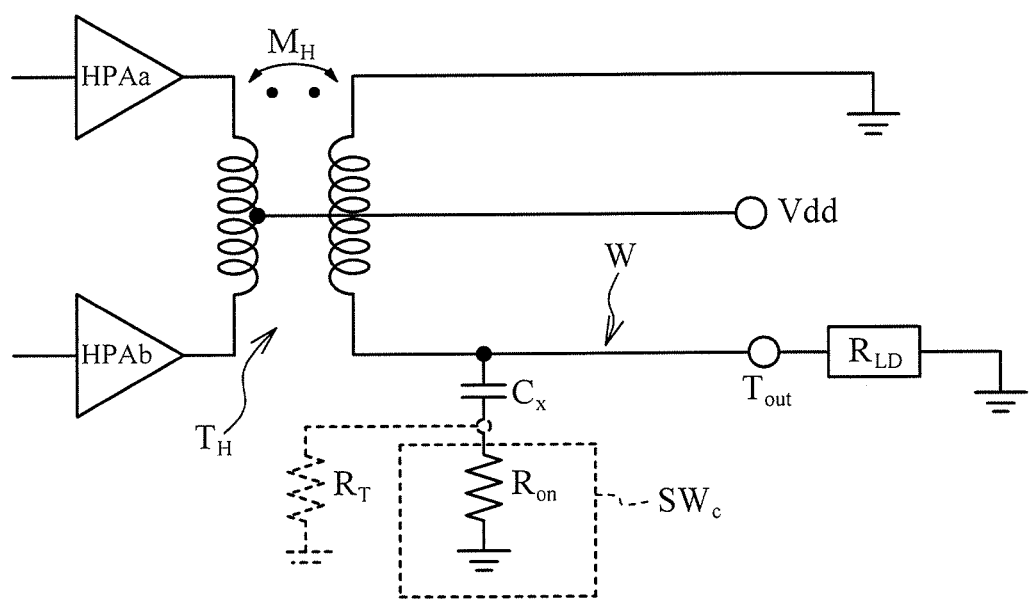
FIG. 5 is a circuit diagram illustrating an equivalent circuit in a high-power mode of the power amplifier according to the first embodiment.

FIG. 5 is a circuit diagram illustrating an equivalent circuit in the high-power mode of the power amplifier according to the first embodiment. The above-mentioned wiring W is grounded via the matching capacitor Cx and the ON-resistor Ron of the transistor TRc. The ON-resistor Ron becomes about 0 ($\Omega$) by enlarging the size of the transistor TRc (Ron<<1). Therefore, the ON-resistor Ron of the transistor TRc becomes a value sufficiently smaller than the parasitic resistance $R_T$ of the low power side transformer $T_L$, and the wiring W is substantially grounded via only the matching capacitor Cx.

Therefore, in the high power mode, a part of the current of the RF signal which flows through the wiring W toward the output terminal Tout flows into the transistor TRc via the matching capacitor Cx, and it hardly flows into the low power side transformer $T_L$. Therefore, the parasitic resistance $R_T$ of the low power side transformer $T_L$ is disregarded in the equivalent circuit (see a dotted line), and a loss caused by the parasitic resistance $R_T$ is restrained. Here, since the ON-resistor Ron is smaller than the parasitic resistance of the inductance element Lc, the current does not flow through the inductance element Lc, either.

On the contrary, when the amplifier with high output power is used in the configuration disclosed by the above-mentioned patent documents 1 (i.e., U.S. Pat. No. 7,728,661), the parasitic resistance (see mark $L'_L$) of the low output power side transformer (see mark 340) cannot be disregarded. Therefore, a loss by the parasitic resistance occurs.

Thus, when the high power amplification circuits HPAa and HPAb amplify the RF signal, the switch circuit SWc grounds the wiring W coupling the high power side transformer $T_H$ and the output terminal Tout, via the resistor Ron having a resistance value lower than the parasitic resistance $R_T$ of the low power side transformer $T_L$. In the present embodiment, in order to make a resistor as small as possible and to minimize the loss, the transistor TRc is provided in the switch circuit SWc, but the switch circuit SWc may not be limited to this. Another element which functions as a switch may be adopted instead of the transistor TRc.

It is desirable that the size of the transistor TRc is large in order to make the ON-resistor Ron small, as mentioned above. However, the larger the size of the transistor TRc, the larger the parasitic capacitance Cds between the drain and the source. In this case, in the low power mode, the transistor TRc becomes the non-conduction state. Therefore, an electric power of the RF signal may leak to the ground via the parasitic capacitance Cds.

Therefore, in the present embodiment, the inductance of the inductance element Lc coupled in parallel with the transistor TRc is set to a suitable value so that the inductance element Lc and the parasitic capacitance Cds constitute a parallel resonant circuit. That is, when a carrier frequency of the RF signal is set to Fc (Hz), the following formula (1) is satisfied about the inductance (Lc) and the parasitic capacitance Cds.

$$Fc = \frac{1}{2\pi\sqrt{Lc \cdot Cds}} \quad (1)$$

Thereby, in the low power mode, the switch circuit SWc becomes a high impedance state. Therefore, in the switch circuit SWc, an on-off ratio (i.e., a ratio of impedance) is enhanced.

Figure 6:
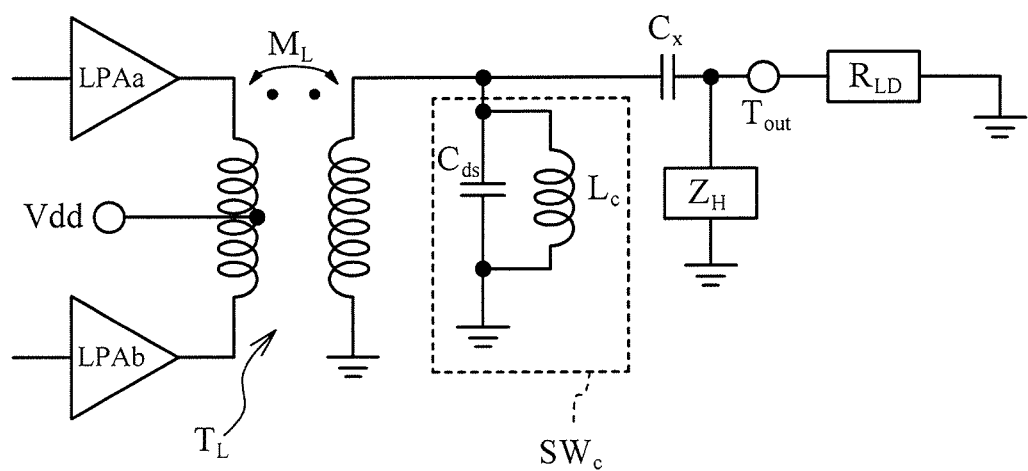
FIG. 6 is a circuit diagram illustrating an equivalent circuit in a low-power mode of the power amplifier according to the first embodiment.

FIG. 6 is a circuit diagram illustrating an equivalent circuit in the low-power mode of the power amplifier according to the first embodiment. Here, an impedance $Z_H$ indicates an equivalent impedance of the high power amplification circuits HPAa and HPAb and the high power side transformer $T_H$.

The RF signal from the low power amplification circuits LPAa and LPAb is outputted from the output terminal Tout via the low power side transformer $T_L$ and the matching capacitor Cx. At this time, the switch circuit SWc is in the high impedance state as described above. Therefore, the current of RF signal does not flow into the switch circuit SWc, and the power loss is prevented.

Thus, when the low power amplification circuits LPAa and LPAb amplify the RF signal, the transistor TRc becomes the non-conduction state. Then, the parasitic capacitance Cds between the drain terminal and the source terminal constitutes a resonance circuit along with the inductance element Lc. Thereby, the amplification efficiency in the low power mode can be improved.

Figure 7:
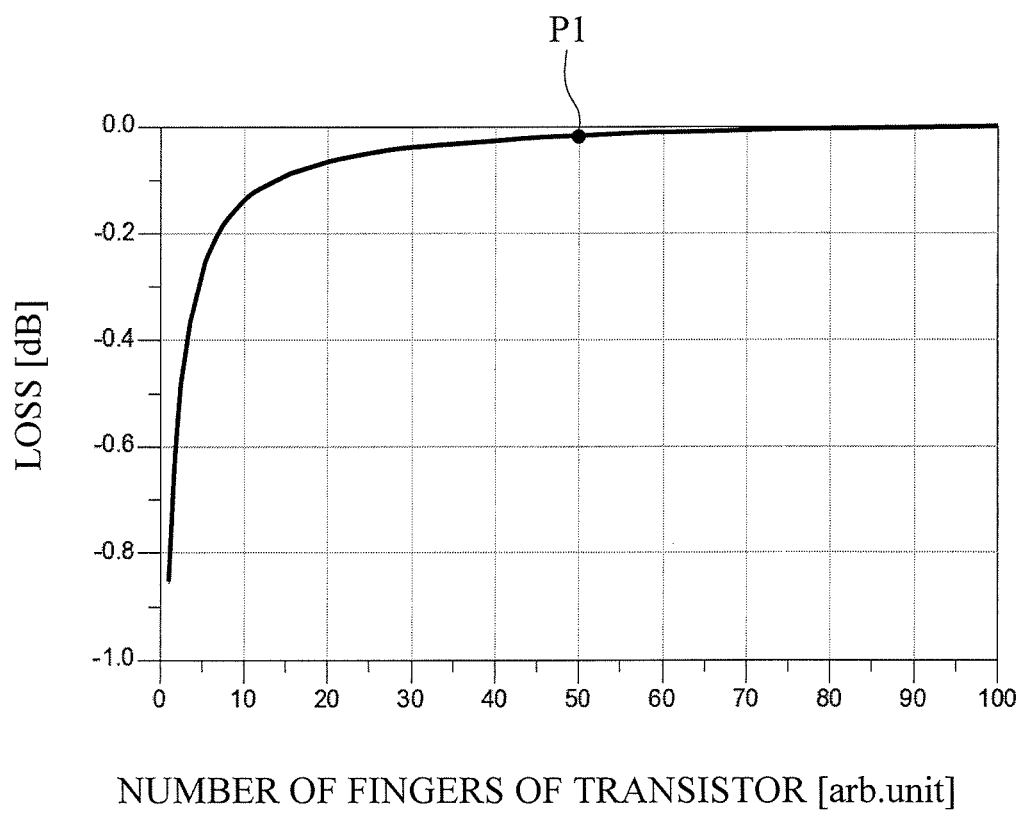
FIG. 7 is a graph illustrating the change of a loss to the number of fingers of a transistor.
Figure 8:
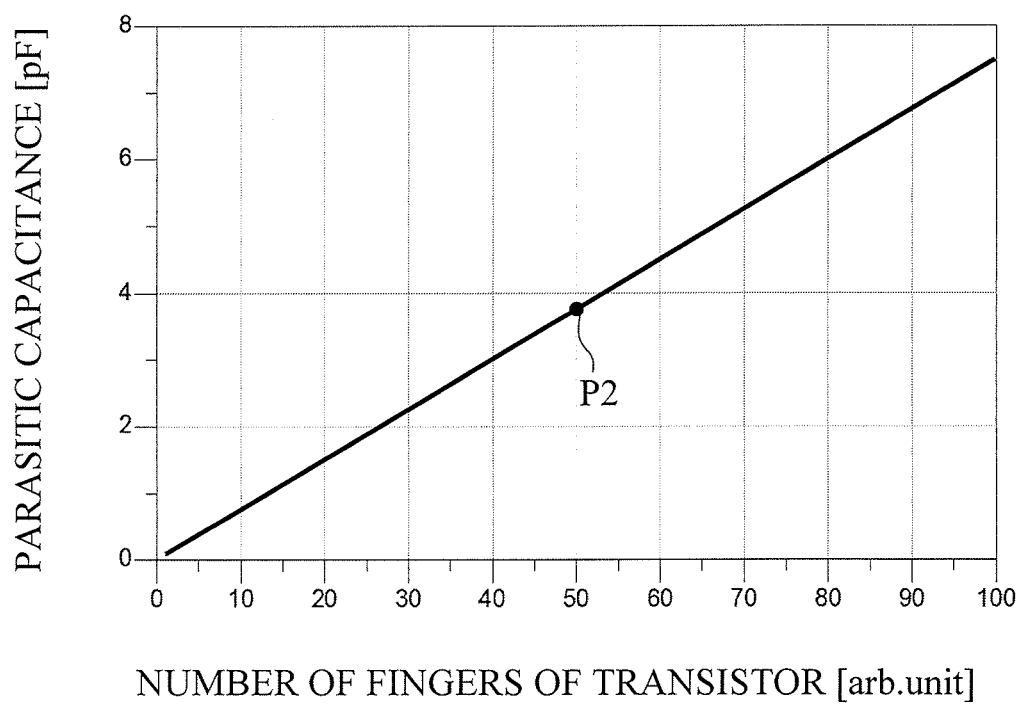
FIG. 8 is a graph illustrating the change of a parasitic capacitance between a drain and a source to the number of fingers of the transistor.

FIG. 7 is a graph illustrating the change of a loss to the number of fingers of the transistor TRc. Moreover, FIG. 8 is a graph illustrating the change of the parasitic capacitance Cds between the drain terminal and the source terminal to the number of fingers of the transistor TRc. The graphs of FIGS. 7 and 8 are the simulation results performed by assuming a CMOS (Complementary Metal Oxide Semiconductor) as a process of the transistor TRc. Here, the number of fingers is a number of elements included in the transistor TRc, and is indicated as a parameter corresponding to the size of the transistor TRc.

The ON-resistor Ron and the parasitic capacitance Cds have a relation of the trade-off mutually. As the number of fingers of the transistor TRc increases, the ON-resistor Ron becomes small. Therefore, the loss approaches 0 (dB), but the parasitic capacitance Cds increases linearly. If the number of fingers is set to 50, the loss becomes smaller than 0.05 (dB) (see mark P1), and the parasitic capacitance Cds is set to about 3.5 (pF) (see mark P2). Here, if the carrier frequency Fc of the RF signal is 2 (GHz), the inductance of the inductance element Lc for constituting a resonant circuit is set to about 1.8 (nH), and becomes a realistic value. Thus, the power amplifier according to the present embodiment is realized easily by assuming the transistor TRc of the CMOS process, for example.

Second Embodiment

In the high power mode of the first embodiment, the transistor TRc is used as a means for coupling the wiring W with the ground, and further may be used as a means for amplifying the RF signal. In the high power mode of the present embodiment, the RF signal is amplified by the high power amplification circuits HPAa and HPAb. In the low power mode, the RF signal is amplified by the low power amplification circuits LPAa and LPAb and the transistor TRc (TRb).

Figure 9:
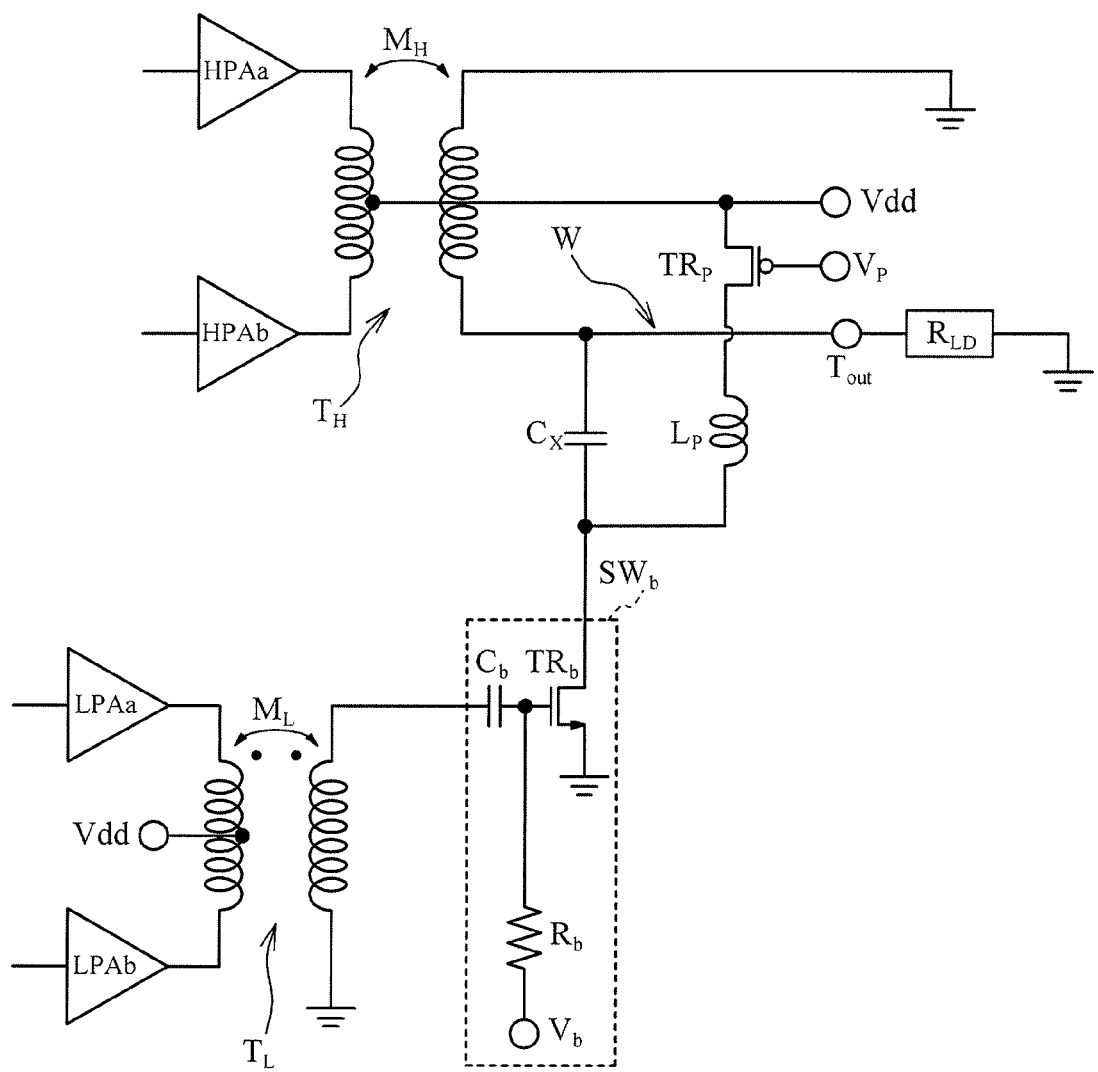
FIG. 9 is a circuit diagram illustrating the circuit configuration of a power amplifier according to a second embodiment.

FIG. 9 is a circuit diagram illustrating the circuit configuration of a power amplifier according to a second embodiment. Here, in FIG. 9, corresponding elements are designated by identical reference numerals in FIG. 4 and description thereof is omitted.

The power amplifier according to the second embodiment includes: the high power amplification circuits HPAa and HPAb; the low power amplification circuits LPAa and LPAb; the high power side transformer $T_H$; and the low power side transformer $T_L$. Moreover, the power amplifier includes: a power feed transistor TRp; a power feed inductance element Lp; the matching capacitor Cx; a switch circuit (connection circuit) SWb; an input terminal of a power feed control voltage Vp; and the output terminal Tout.

In the present embodiment, the switch circuit SWb functions as an amplification means of the RF signal in the low power mode, unlike the first embodiment. The secondary side of the low power side transformer $T_L$ is coupled with the wiring W via the switch circuit SWb and the matching capacitor Cx. The switch circuit SWb includes a transistor TRb, a capacitor Cb, an adjusting resistor Rb, and an input terminal of a control voltage Vb.

A drain of the transistor TRb is coupled with the wiring W via the matching capacitor Cx. A source terminal of the transistor TRb is grounded. A gate terminal of the transistor TRb is coupled with the low power amplification circuits LPAa and LPAb via the capacitor Cb and the secondary side of the low power side transformer $T_L$. The RF signal is inputted to the gate terminal of the transistor TRb. At this time, the capacitor Cb functions as a filter that removes a direct-current component of the RF signal.

In addition, the gate terminal of the transistor TRb is coupled with the input terminal of the control voltage Vb via the adjusting resistor Rb. The control voltage Vb is applied to the gate terminal from the outside. At this time, the control voltage Vb is adjusted to a suitable value by the adjusting resistor Rb.

In the low power mode, the control voltage Vb becomes a bias voltage for operating the transistor TRb as a class-B amplifier, for example, that is, becomes a threshold voltage of the transistor TRb or a value close to the threshold voltage. In the present embodiment, as a class of the amplification operation with the transistor TRb, the B-class is selected from a viewpoint of the amplification efficiency. However, the class of the amplification operation is not limited to this, but may be an A-class or a C-class.

In the low power mode, in order to operate the transistor TRb as an amplifier, the power supply voltage Vdd is applied to the drain terminal of the transistor TRb via the power feed transistor TRp and the power feed inductance element Lp. The power feed transistor TRp is controlled by the conduction state or the non-conduction state according to the power feed control voltage Vp applied to the gate terminal from the outside. Here, in the present embodiment, the power feed transistor TRp is a FET with a p-type channel in order to make the power feed control voltage Vp equal to or less than the power supply voltage Vdd. However, the power feed transistor TRp is not limited to this, but may be a FET with an n-type channel.

A source terminal of the power feed transistor TRp is coupled with the power supply, i.e., the power supply terminal of the power supply voltage Vdd. A drain terminal of the power feed transistor TRp is coupled with one end of the power feed inductance element Lp. Moreover, another end of the power feed inductance element Lp is coupled with the drain terminal of the transistor TRb. The power feed inductance element Lp functions as a power feed means to the transistor TRb and an impedance matching means.

In the low power mode, the power feed transistor TRp becomes the conduction state in order to supply the power supply voltage Vdd to the transistor TRb. At this time, a given bias voltage as the control voltage Vb is applied to the gate terminal of the power feed transistor TRp so as to operate the power feed transistor TRp as an amplifier.

Figure 10:
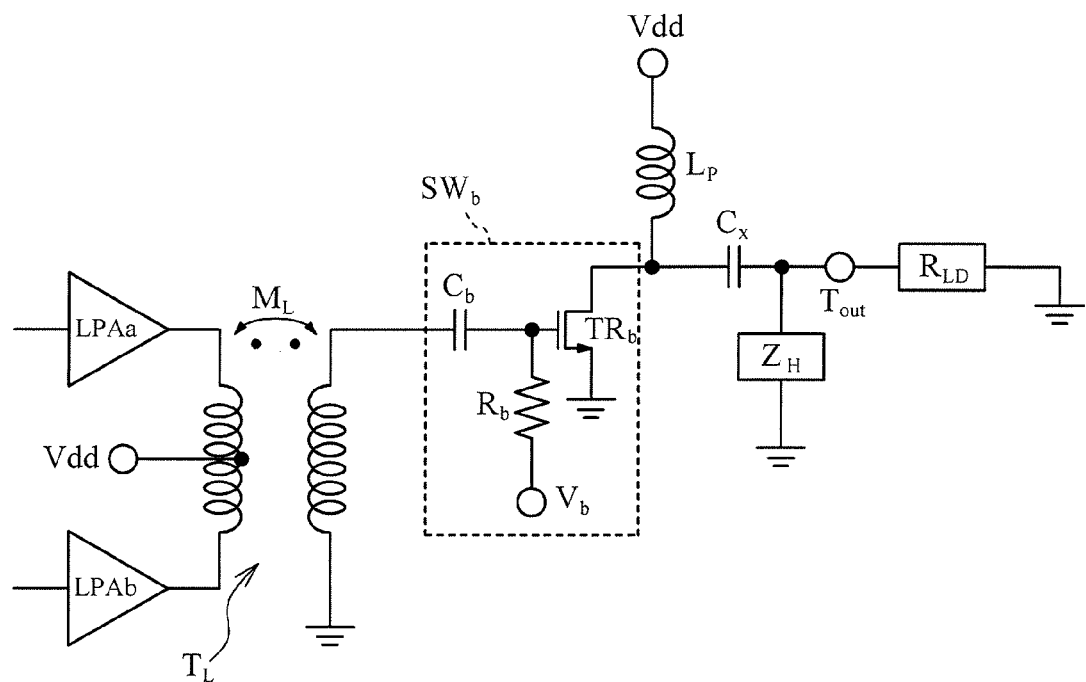
FIG. 10 is a circuit diagram illustrating an equivalent circuit in the low-power mode of the power amplifier according to the second embodiment.

FIG. 10 is a circuit diagram illustrating an equivalent circuit in the low-power mode of the power amplifier according to the second embodiment. The RF signal amplified by the low power amplification circuits LPAa and LPAb is inputted to the gate terminal of the transistor TRb via the low power side transformer $T_L$ and the capacitor Cb. A bias voltage is applied to the gate terminal of the transistor TRb, so that the transistor TRb further amplifies the inputted RF signal.

Thus, in the low power mode of the present embodiment, not only the low power amplification circuits LPAa and LPAb but also the transistor TRb amplify the RF signal. The size of the amplifying element in each of the low power amplification circuits LPAa and LPAb can be made smaller than that of the first embodiment.

On the other hand, in the high power mode, the power feed transistor TRp becomes the non-conduction state so that the power feeding to the transistor TRb is stopped. At this time, a high-level voltage (e.g. the power supply voltage Vdd) for making the transistor TRb into the conduction state is applied to the gate terminal of the transistor TRb as the control voltage Vb.

Figure 11:
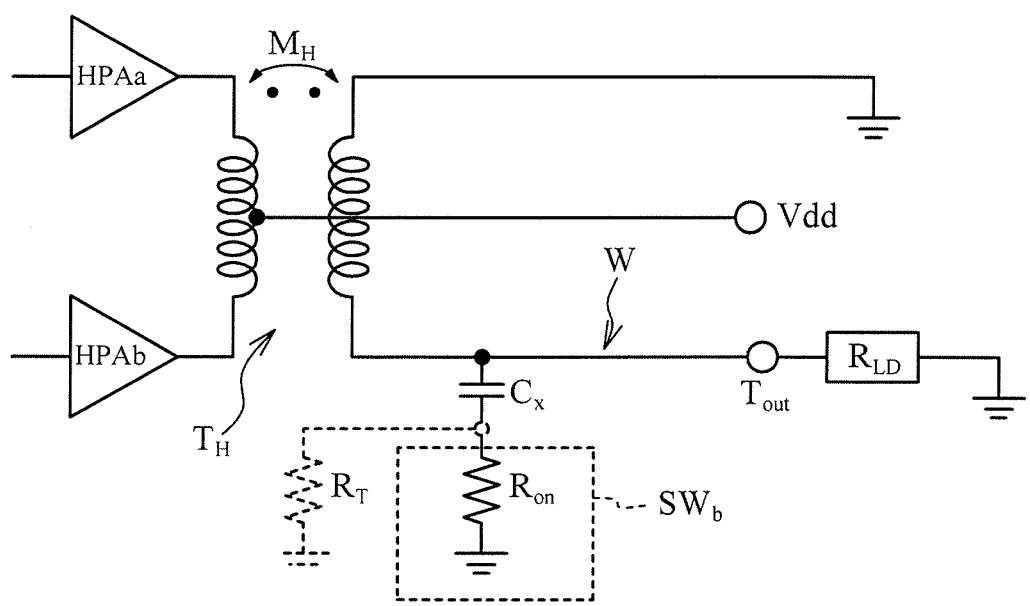
FIG. 11 is a circuit diagram illustrating an equivalent circuit in the high-power mode of the power amplifier according to the second embodiment.

FIG. 11 is a circuit diagram illustrating an equivalent circuit in the high-power mode of the power amplifier according to the second embodiment. As is the case with the transistor TRc of the first embodiment, the transistor TRb becomes the conduction state, so that the wiring W coupling the high power side transformer $T_H$ and the output terminal Tout is grounded via the ON-resistor Ron of the transistor TRb. That is, the wiring W is coupled with the ground in the viewpoint of the AC signal. The ON-resistor Ron becomes about 0 (Ω) by making the transistor TRb into a suitable size. Therefore, the equivalent circuit in the high power mode is the same composition as that of the first embodiment (see FIG. 5), and can also obtain the above-mentioned effects similarly.

Third Embodiment

The power amplifier according to the first and the second embodiments has two operating states of the high power mode and the low power mode. In addition, the power amplifier may include a middle power mode having a middle output level between the high power mode and the low power mode. Thereby, since more ranges N1 to N3 of the output power illustrated in FIG. 3 can be provided, the overall amplification efficiency of the power amplifier improves.

Figure 12:
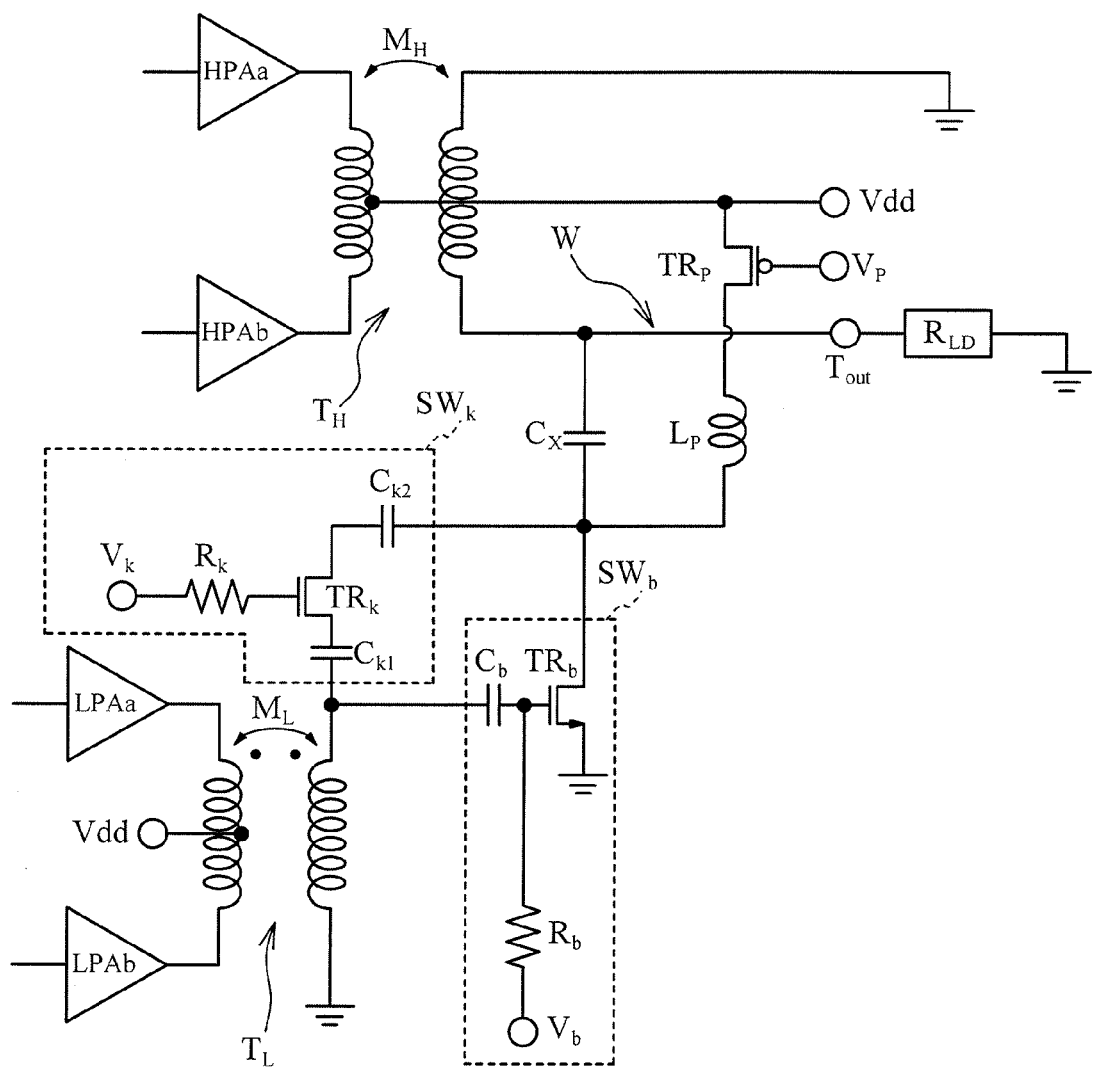
FIG. 12 is a circuit diagram illustrating the circuit configuration of a power amplifier according to a third embodiment.

FIG. 12 is a circuit diagram illustrating the circuit configuration of the power amplifier according to a third embodiment. Here, in FIG. 12, corresponding elements are designated by identical reference numerals in FIG. 9 and description thereof is omitted.

The power amplifier includes: the high power amplification circuits HPAa and HPAb; the low power amplification circuits LPAa and LPAb; the high power side transformer $T_H$; and the low power side transformer $T_L$. Moreover, the power amplifier includes: the power feed transistor TRp; the power feed inductance element Lp; the matching capacitor Cx; the switch circuit SWb; an auxiliary switch circuit (auxiliary connection circuit) SWk; the input terminal of the power feed control voltage Vp; and the output terminal Tout. The switch circuit SWb includes the transistor TRb, the capacitor Cb, the adjusting resistor Rb, and the input terminal of the control voltage Vb.

In the present embodiment, as is the case with the high power mode of the first embodiment and the second embodiment, the high power mode is an operating state in which only the high power amplification circuits HPAa and HPAb amplify the RF signal. In the high power mode, the transistor TRb and the power feed transistor TRp are controlled to the non-conduction state.

As is the case with the low power mode of the second embodiment, the middle power mode is an operating state in which the low power amplification circuits LPAa and LPAb and the transistor TRb of the switch circuit SWb amplify the RF signal. In the middle power mode, the bias voltage is applied to the gate terminal of the transistor TRb in order to amplify the RF signal, and the power feed transistor TRp is controlled to the conduction state.

As is the case with the low power mode of the first embodiment, the low power mode is an operating state in which only the low power amplification circuits LPAa and LPAb amplify the RF signal. In the low power mode, the transistor TRb and the power feed transistor TRp are controlled to the non-conduction state.

The power amplifier according to the present embodiment has the auxiliary switch circuit SWk in addition to the circuit configuration illustrated in FIG. 9 to realize the low power mode. Since only the low power amplification circuits LPAa and LPAb amplify the RF signal in the low power mode, the transistor TRb is controlled to the non-conduction state according to the control voltage Vb, and the power feed transistor TRp is also controlled to the non-conduction state according to the power feed control voltage Vp.

When the low power amplification circuits LPAa and LPAb amplify the RF signal and the transistor TRb is in the non-conduction state (i.e., the above-mentioned low power mode), the auxiliary switch circuit SWk bypasses the transistor TRb, and couples the secondary side of the low power side transformer $T_L$ with the above-mentioned wiring W. That is, in the low power mode, the auxiliary switch circuit SWk couples the low power amplification circuits LPAa and LPAb with the output terminal Tout via a path which does not pass the transistor TRb. Thereby, in the low power mode, the RF signal amplified by the low power amplification circuits LPAa and LPAb is outputted to the load circuit $R_{LD}$ via the auxiliary switch circuit SWk.

More specifically, the auxiliary switch circuit SWk includes: a switching transistor TRk; a first capacitor Ck1; a second capacitor Ck2; an adjusting resistor Rk; and an input terminal of a switching control voltage Vk. One of a source terminal and a drain terminal of the switching transistor TRk is coupled with the low power side transformer $T_L$ via the first capacitor Ck1, and another one of the source terminal and the drain terminal is coupled with the matching capacitor Cx via the second capacitor Ck2.

Each of the first capacitor Ck1 and the second capacitor Ck2 functions as a filter that removes a direct-current component of the RF signal. Here, it is desirable that the switching transistor TRk has a same size as the low power amplification circuits LPAa and LPAb in order to restrain the loss.

The gate terminal of the switching transistor TRk is coupled with the input terminal of the switching control voltage Vk via the adjusting resistor Rk. The switching control voltage Vk is applied to the gate terminal of the switching transistor TRk from the outside. At this time, the switching control voltage Vk is adjusted to a suitable value by the adjusting resistor Rk.

The switching transistor TRk is switched to the conduction state or the non-conduction state according to the switching control voltage Vk. In the case of the low power mode, the switching transistor TRk becomes the conduction state. In the case of another power mode, the switching transistor TRk becomes the non-conduction state. That is, the switching control voltage Vk is determined according to the operating state (the low power mode or the another power mode) of the power amplifier.

Figure 13:
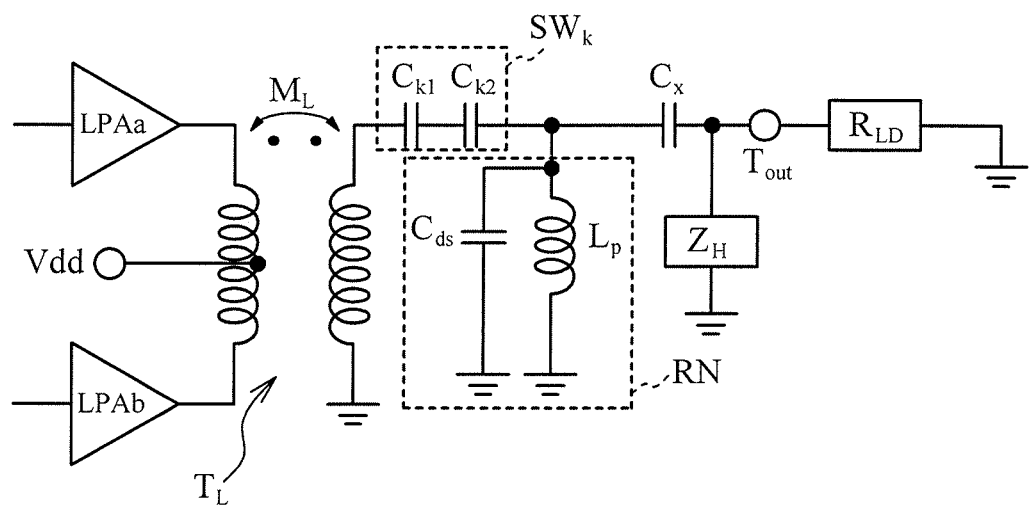
FIG. 13 is a circuit diagram illustrating an equivalent circuit in the low-power mode of the power amplifier according to the third embodiment.

FIG. 13 is a circuit diagram illustrating an equivalent circuit in the low-power mode of the power amplifier according to the third embodiment. Since the switching transistor TRk is in the conduction state, the low power amplification circuits LPAa and LPAb are coupled with the load circuit $R_{LD}$ via the low power side transformer $T_L$, the first capacitor Ck1, the second capacitor Ck2 and the matching capacitor Cx. Here, the equivalent impedance $Z_H$ of the high power amplification circuits HPAa and HPAb and the high power side transformer $T_H$ is coupled between the matching capacitor Cx and the load circuit $R_{LD}$.

In the low power mode, the transistor TRb and the power feed transistor TRp are in the non-conduction state. Thereby, in the transistor TRb, the parasitic capacitance Cds between the drain terminal and the source terminal constitutes a resonance circuit RN along with the power feed inductance element Lp.

Specifically, in the low power mode, the power feed inductance element Lp is coupled with a power supply which supplies the power supply voltage Vdd, via the power feed transistor TRp of the non-conduction state. Since a large-volume decoupling capacitor for noise rejection is provided in the power supply, it is considered that one end of the power feed inductance element Lp is grounded via the low impedance, in the viewpoint of the AC signal.

On the other hand, one end of the power feed inductance element Lp is grounded via the parasitic capacitance Cds of the transistor TRb. Thereby, the parasitic capacitance Cds and the power feed inductance element Lp constitute the resonance circuit RN, and become a high impedance state. Therefore, as is the case with the low power mode according to the first embodiment (see FIG. 6), a current of the RF signal does not flow into the parasitic capacitance Cds of the transistor TRb, and hence the power loss is prevented.

Figure 14:
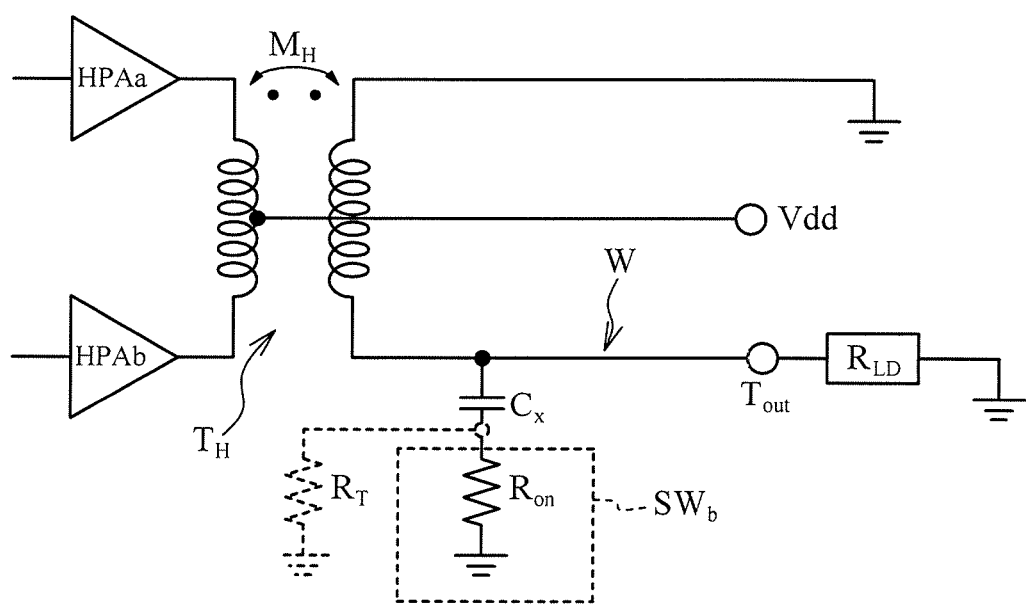
FIG. 14 is a circuit diagram illustrating an equivalent circuit in the high-power mode of the power amplifier according to the third embodiment.

FIG. 14 is a circuit diagram illustrating an equivalent circuit in the high-power mode of the power amplifier according to the third embodiment. In the high power mode, the transistor TRb is in the conduction state, and the power feed transistor TRp and the switching transistor TRk are in the non-conduction state.

As is the case with the transistor TRc according to the first embodiment, the transistor TRb becomes the conduction state, so that the transistor TRb grounds the wiring W coupling the high power side transformer $T_H$ and the output terminal Tout via the ON-resistor Ron of the transistor TRb. The ON-resistor Ron becomes about 0 (Ω) by making the transistor TRb into a suitable size. Therefore, the equivalent circuit is the same composition as that of the first embodiment (see FIG. 5), and can also obtain the above-mentioned effects similarly.

Figure 15:
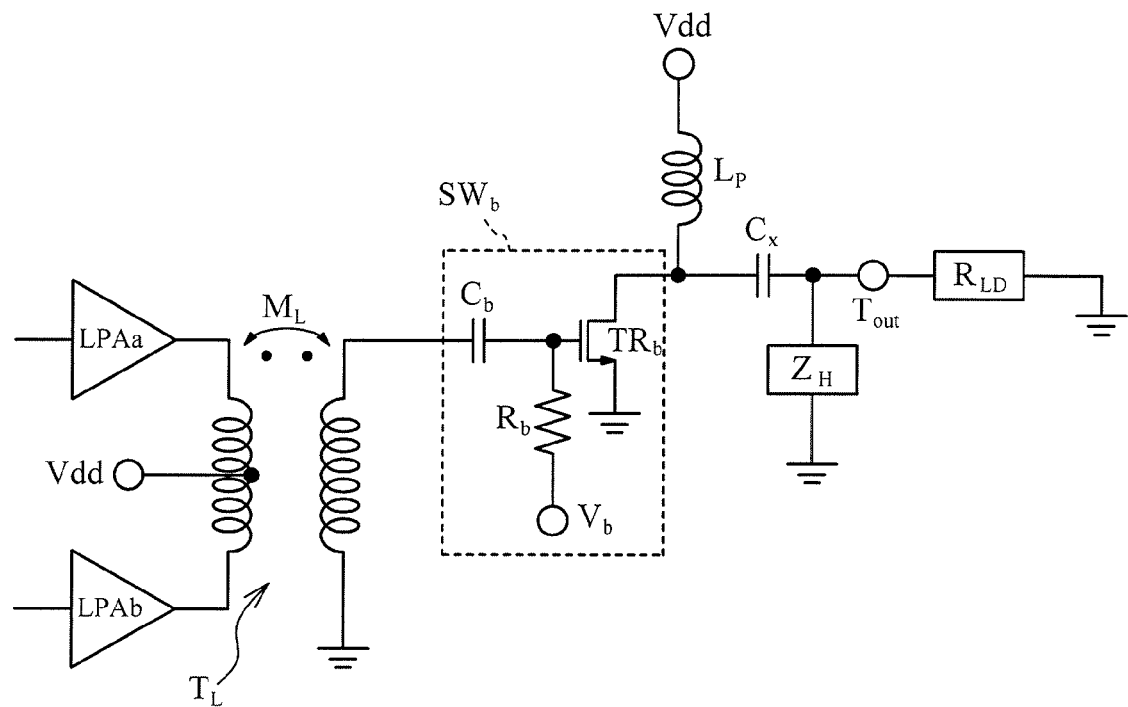
FIG. 15 is a circuit diagram illustrating an equivalent circuit in the middle power mode of the power amplifier according to the third embodiment.

FIG. 15 is a circuit diagram illustrating an equivalent circuit in the middle power mode of the power amplifier according to the third embodiment. In the middle power mode, the switching transistor TRk is in the non-conduction state, and the power feed transistor TRp is in the conduction state. A bias voltage is applied to the gate terminal of the transistor TRb.

The RF signal amplified by the low power amplification circuits LPAa and LPAb is inputted to the gate terminal of the transistor TRb via the low power side transformer $T_L$ and the capacitor Cb. The bias voltage is applied to the gate terminal of the transistor TRb, so that the transistor TRb further amplifies the inputted RF signal. Therefore, the equivalent circuit is the same composition as that of the second embodiment (see FIG. 10), and can also obtain the above-mentioned effects similarly.

Figure 16:
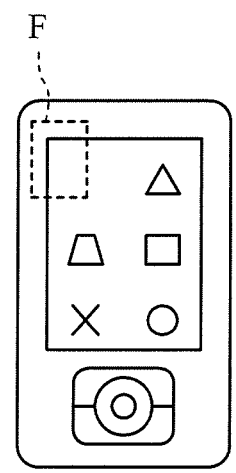
FIG. 16 is a diagram illustrating an example of a mounting portion of the power amplifier in a communication device.

The above-mentioned power amplifier is provided in a communication device, for example. FIG. 16 illustrates an example of a mounting portion of the power amplifier in a communication device.

The power amplifier is provided in a front end portion F of a portable communication device, such as a smart phone, for example. The front end portion F indicates a transmitting and receiving circuit in an antenna side.

Figure 17:
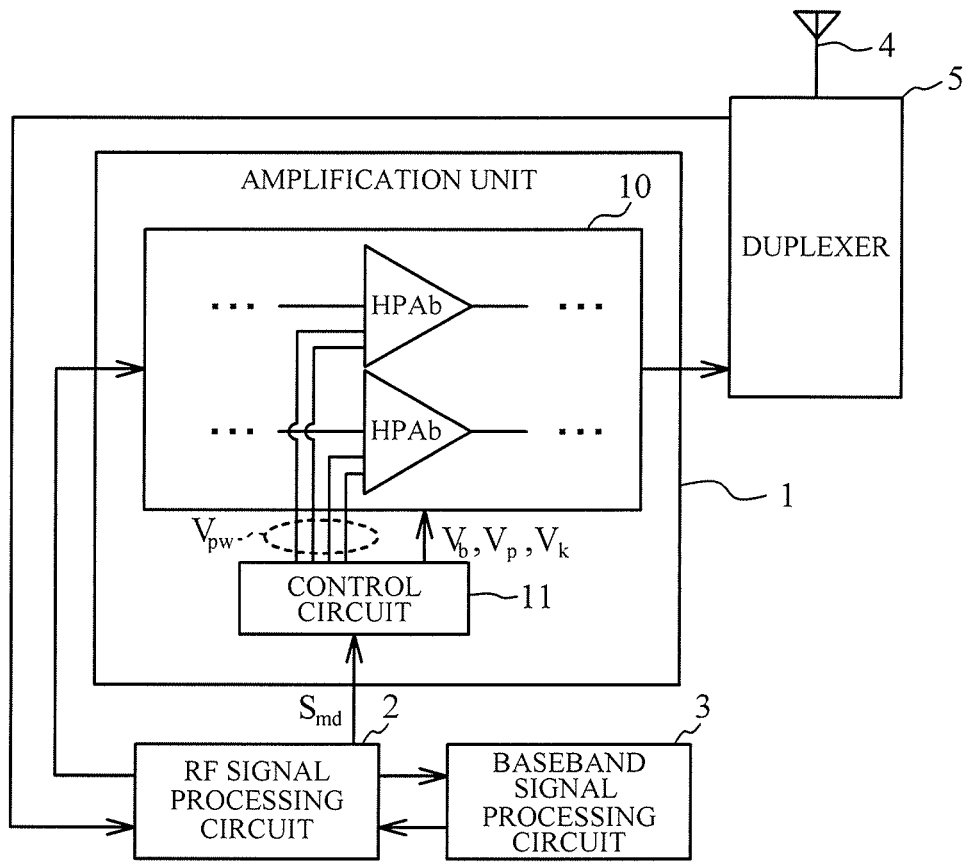
FIG. 17 is a block diagram illustrating the mechanism configuration of the communication device according the embodiments.

FIG. 17 is a block diagram illustrating the mechanism configuration of the communication device according the embodiments. FIG. 17 indicates an example of the configuration of the above-mentioned front end portion F. The communication device includes an amplification unit 1, an RF signal processing circuit (i.e., a signal processor) 2, a baseband signal processing circuit 3, an antenna 4 and a duplexer 5.

The baseband signal processing circuit 3 performs band processing of a data signal. The baseband signal processing circuit 3 modulates the data signal, and outputs the modulated data signal to the RF signal processing circuit 2. As a modulation method, an orthogonal frequency divisional multiplexing (OFDM) is considered, for example, but the modulation method is not limited to this.

The RF signal processing circuit 2 includes an oscillator and a multiplier (e.g. a mixer), up-converts the modulated data signal into the RF signal. That is, the RF signal processing circuit 2 converts the frequency of the data signal into a carrier frequency (radio frequency) from a baseband frequency.

Moreover, the RF signal processing circuit 2 outputs a mode designation signal (i.e., a designation signal) Smd to the amplification unit 1 in order to designate the operational mode of the power amplifier. The mode designation signal Smd is a signal which designates an operation target among from the high power amplification circuits HPAa and HPAb and the low power amplification circuits LPAa and LPAb to be operated. The RF signal processing circuit 2 selects a suitable operational mode, for example based on a communication result between the communication device and a base station.

The amplification unit 1 has a power amplifier 10 having the above-mentioned configuration and a control circuit 11, and amplifies the RF signal and outputs the amplified RF signal to the duplexer 5. The amplified RF signal is transmitted by the antenna 4.

The control circuit 11 gives an operating voltage Vpw, the control voltage Vb, the power feed control voltage Vp and the switching control voltage Vk to the power amplifier 10. In the present embodiment, the above-mentioned power amplifier according to the third embodiment is assumed as the power amplifier 10, but another power amplifier according to other embodiments may be assumed as the power amplifier 10.

The control circuit 11 controls the operating voltage Vpw to be given to the power amplifier 10, according to the mode designation signal Smd from the RF signal processing circuit 2. The operating voltage Vpw is individually given to the high power amplification circuits HPAa and HPAb and the low power amplification circuits LPAa and LPAb. Thereby, the power amplifier 10 is controlled by an optimal operational mode.

In the case of the high power mode, the operating voltage Vpw required for amplification operation is given to the high power amplification circuits HPAa and HPAb, and the operating voltage Vpw for stopping the amplification operation is given to the low power amplification circuits LPAa and LPAb. In the case of the middle power mode and the low power mode, adversely, the operating voltage Vpw required for the amplification operation is given to the low power amplification circuits LPAa and LPAb, and the operating voltage Vpw for stopping the amplification operation is given to the high power amplification circuits HPAa and HPAb.

In addition, the control circuit 11 controls the control voltage Vb, the power feed control voltage Vp and the switching control voltage Vk which are given to the power amplifier 10, according to the mode designation signal Smd from the RF signal processing circuit 2. In the case of the high power mode, the control unit 11 gives the control voltage Vb to the power amplifier 10 so that the transistor TRb becomes the conduction state. The control unit 11 gives the power feed control voltage Vp to the power amplifier 10 so that the power feed transistor TRp becomes the non-conduction state. Moreover, the control unit 11 gives the switching control voltage Vk to the power amplifier 10 so that the switching transistor TRk becomes the non-conduction state.

In the case of the middle power mode, the control circuit 11 gives the control voltage Vb (the above-mentioned bias voltage) to the power amplifier 10 so that the transistor TRb amplifies the RF signal. The control circuit 11 gives the power feed control voltage Vp to the power amplifier 10 so that the power feed transistor TRp becomes the conduction state. Moreover, the control circuit 11 gives the switching control voltage Vk to the power amplifier 10 so that the switching transistor TRk becomes the non-conduction state.

In the case of the low power mode, the control circuit 11 gives the control voltage Vb to the power amplifier 10 so that the transistor TRb becomes the non-conduction state. The control circuit 11 gives the power feed control voltage Vp to the power amplifier 10 so that the power feed transistor TRp becomes the non-conduction state. Moreover, the control circuit 11 gives the switching control voltage Vk to the power amplifier 10 so that the switching transistor TRk becomes the conduction state.

Here, when the power amplifier according to the first embodiment is used as the power amplifier 10, the control voltage Vc in the high power mode and the low power mode is controlled in the same manner as the control voltage Vb in the above-mentioned high power mode and the above-mentioned low power mode. When the power amplifier according to the second embodiment is used, the control voltage Vb and the power feed control voltage Vp in the high power mode and the low power mode are controlled in the same manner as those in the above-mentioned high power mode and the above-mentioned middle power mode, respectively.

The duplexer 5 filters the RF signal transmitted and received through the antenna 4. That is, the duplexer 5 filters the RF signal inputted from the amplification unit 1, with a filter which sets a transmission frequency as a pass band, and outputs the filtered RF signal to the antenna 4. Moreover, the duplexer 5 filters the RF signal inputted from the antenna 4, with a filter which sets a reception frequency as the pass band, and outputs the filtered RF signal to the RF signal processing circuit 2.

Since the communication device according to the embodiment has the above-mentioned power amplifier, the communication device obtains the above-mentioned effects similarly.

As described above, the power amplifier according to the embodiment includes: the high power amplification circuits HPAa and HPAb; the low power amplification circuits LPAa and LPAb; the high power side transformer $T_H$; the low power side transformer $T_L$; and switch circuits SWc and SWb. The high power amplification circuits HPAa and HPAb; the low power amplification circuits LPAa and LPAb are controlled so that ones of the high power amplification circuits HPAa and HPAb and the low power amplification circuits LPAa and LPAb do not amplify the RF signal when another ones of them amplify the RF signal. Any ones of the high power amplification circuits HPAa and HPAb and the low power amplification circuits LPAa and LPAb amplify the RF signal, and output the amplified RF signal from the common output terminal Tout.

The high power side transformer $T_H$ is coupled between the high power amplification circuits HPAa and HPAb and the output terminal Tout, and converts the output impedance of the high power amplification circuits HPAa and HPAb. The low power side transformer $T_L$ is coupled between the low power amplification circuits LPAa and LPAb and the wiring W coupling the high power side transformer $T_H$ and the output terminal Tout, and converts the output impedance of the low power amplification circuits LPAa and LPAb.

When the high power amplification circuits HPAa and HPAb amplify the RF signal, the switch circuits SWc and SWb couple the wiring W coupling the high power amplification circuits HPAa and HPAb and the output terminal Tout with the ground which is a reference potential. Thereby, the switch circuits SWc and SWb form the current path which bypasses the low power side transformer $T_L$ between the wiring W coupling the high power side transformer $T_H$ and the output terminal Tout, and the ground.

Therefore, a part of the current of the RF signal which flows into the output terminal Tout from the high power amplification circuits HPAa and HPAb via the high power side transformer $T_H$ is led to the switch circuit SWc and SWb instead of the low power side transformer $T_L$. Thereby, the power loss caused by the low power side transformer $T_L$ is restrained, and the amplification efficiency of the power amplifier is improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A power amplifier, comprising:
a first amplifier circuit and a second amplifier circuit that are controlled so that one of the first and the second amplifier circuits does not amplify a signal when another one of the first and the second amplifier circuits amplifies the signal, the another one configured to amplify the signal and to output the amplified signal from a common output terminal;
a first impedance conversion circuit that is coupled between the first amplifier circuit and the output terminal, and is configured to convert an output impedance of the first amplifier circuit;
a second impedance conversion circuit that is coupled between the second amplifier circuit and a wiring coupling the first impedance conversion circuit and the output terminal, and is configured to convert an output impedance of the second amplifier circuit; and
a connection circuit that, when the first amplifier circuit amplifies the signal, forms a path which bypasses the second impedance conversion circuit between a reference potential and the wiring coupling the first impedance conversion circuit and the output terminal, by coupling a wiring coupling the first amplifier circuit and the output terminal, with the reference potential.

2. The power amplifier as claimed in claim 1, wherein
the connection circuit includes a transistor having one terminal coupled to the reference potential, and another terminal coupled to the wiring coupling the first impedance conversion circuit and the output terminal, and
when the first amplifier circuit amplifies the signal, the transistor becomes in a conduction state to couple the wiring coupling the first impedance conversion circuit and the output terminal, with the reference potential.

3. The power amplifier as claimed in claim 2, wherein
the connection circuit includes an inductance element coupled in parallel with the transistor, and
when the second amplifier circuit amplifies the signal, the transistor becomes in a non-conduction state, and the inductance element and a parasitic capacitance between the one terminal and the another terminal of the transistor constitute a resonant circuit.

4. The power amplifier as claimed in claim 2, wherein
the second amplifier circuit is coupled to a control terminal of the transistor via the second impedance conversion circuit, and
when the second amplifier circuit amplifies the signal, a bias voltage is applied to the control terminal so that the transistor amplifies the signal inputted from the second amplifier circuit via the control terminal.

5. The power amplifier as claimed in claim 4, comprising:
an auxiliary switch circuit that bypasses the transistor and couples the second impedance conversion circuit with the wiring coupling the first impedance conversion circuit and the output terminal when the second amplifier circuit amplifies the signal and the transistor is in the non-conduction state.

6. The power amplifier as claimed in claim 5, comprising:
a power feed inductance element that has one terminal coupled to the another terminal of the transistor; and
a power feed transistor that has one terminal coupled to a power supply and another terminal coupled to another terminal of the power feed inductance element, and becomes in a conduction state when the bias voltage is applied to the control terminal of the transistor;
wherein when the transistor is in the non-conduction state and the power feed transistor is in the non-conduction state, the power feed inductance element and the parasitic capacitance between the one terminal and the another terminal of the transistor constitutes a resonant circuit.

7. The power amplifier as claimed in claim 1, wherein
the first amplifier circuit is larger in a size of an amplifying element than the second amplifier circuit, and configured to output a signal having an output power higher than the second amplifier circuit.

8. The power amplifier as claimed in claim 1, comprising a capacitor coupled between the connection circuit and the wiring coupling the first impedance conversion circuit and the output terminal.

9. The power amplifier as claimed in claim 1, wherein
the second impedance conversion circuit includes a transformer, a primary side of the transformer is coupled to the second amplifier circuit, one terminal of a secondary side of the transformer is coupled to the wiring coupling the first impedance conversion circuit and the output terminal, and another terminal of the secondary side of the transformer is connected to the reference potential.

10. A communication device, comprising:
a power amplifier;
a signal processor that is configured to convert a frequency of a signal and to output the frequency-converted signal to the power amplifier; and
an antenna that is configured to transmit the signal amplified by the power amplifier;

the power amplifier, including:
a first amplifier circuit and a second amplifier circuit that are controlled so that one of the first and the second amplifier circuits does not amplify the signal when another one of the first and the second amplifier circuits amplifies the signal, the another one configured to amplify the signal and to output the amplified signal from a common output terminal;
a first impedance conversion circuit that is coupled between the first amplifier circuit and the output terminal, and is configured to convert an output impedance of the first amplifier circuit;
a second impedance conversion circuit that is coupled between the second amplifier circuit and a wiring coupling the first impedance conversion circuit and the output terminal, and is configured to convert an output impedance of the second amplifier circuit; and
a connection circuit that, when the first amplifier circuit amplifies the signal, forms a path which bypasses the second impedance conversion circuit between a reference potential and the wiring coupling the first impedance conversion circuit and the output terminal, by coupling a wiring coupling the first amplifier circuit and the output terminal, with the reference potential.

11. The communication device as claimed in claim 10, wherein
the signal processor is configured to output a designation signal which designates an operation target among from the first amplifier circuit and the second amplifier circuit, and
the power amplifier includes a control circuit that is configured to control the operation of the first amplifier circuit and the second amplifier circuit in accordance with the designation signal.

12. The communication device as claimed in claim 10, wherein
the connection circuit includes a transistor having one terminal coupled to the reference potential, and another terminal coupled to the wiring coupling the first impedance conversion circuit and the output terminal, and
when the first amplifier circuit amplifies the signal, the transistor becomes in a conduction state to couple the wiring coupling the first impedance conversion circuit and the output terminal, with the reference potential.

13. The communication device as claimed in claim 12, wherein
the connection circuit includes an inductance element coupled in parallel with the transistor, and
when the second amplifier circuit amplifies the signal, the transistor becomes in a non-conduction state, and the inductance element and a parasitic capacitance between the one terminal and the another terminal of the transistor constitute a resonant circuit.

14. The communication device as claimed in claim 12, wherein
the second amplifier circuit is coupled to a control terminal of the transistor via the second impedance conversion circuit, and
when the second amplifier circuit amplifies the signal, a bias voltage is applied to the control terminal so that the transistor amplifies the signal inputted from the second amplifier circuit via the control terminal.

15. The communication device as claimed in claim 14, comprising: an auxiliary switch circuit that bypasses the transistor and couples the second impedance conversion circuit with the wiring coupling the first impedance conversion circuit and the output terminal when the second amplifier circuit amplifies the signal and the transistor is in the non-conduction state.

16. The communication device as claimed in claim 15, comprising:
a power feed inductance element that has one terminal coupled to the another terminal of the transistor; and
a power feed transistor that has one terminal coupled to a power supply and another terminal coupled to another terminal of the power feed inductance element, and becomes in a conduction state when the bias voltage is applied to the control terminal of the transistor;
wherein when the transistor is in the non-conduction state and the power feed transistor is in the non-conduction state, the power feed inductance element and the parasitic capacitance between the one terminal and the another terminal of the transistor constitutes a resonant circuit.

17. The communication device as claimed in claim 10, wherein
the first amplifier circuit is larger in a size of an amplifying element than the second amplifier circuit, and configured to output a signal having an output power higher than the second amplifier circuit.

18. The communication device as claimed in claim 10, comprising a capacitor coupled between the connection circuit and the wiring coupling the first impedance conversion circuit and the output terminal.

19. The communication device as claimed in claim 10, wherein
the second impedance conversion circuit includes a transformer, a primary side of the transformer is coupled to the second amplifier circuit, one terminal of a secondary side of the transformer is coupled to the wiring coupling the first impedance conversion circuit and the output terminal, and another terminal of the secondary side of the transformer is connected to the reference potential.

\* \* \* \* \*